(12) United States Patent
Xie et al.

(10) Patent No.: US 10,665,692 B2
(45) Date of Patent: May 26, 2020

(54) NON-SELF ALIGNED GATE CONTACTS FORMED OVER THE ACTIVE REGION OF A TRANSISTOR

(71) Applicant: International Business Machines Corporation, Armonk, NY (US)

(72) Inventors: Ruilong Xie, Schenectady, NY (US); Chanro Park, Clifton Park, NY (US); Kangguo Cheng, Schenectady, NY (US); Julien Frougier, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/169,161

(22) Filed: Oct. 24, 2018

(65) Prior Publication Data

US 2020/0135885 A1    Apr. 30, 2020

(51) Int. Cl.
```
H01L 29/66      (2006.01)
H01L 21/768     (2006.01)
H01L 29/78      (2006.01)
H01L 21/02      (2006.01)
H01L 21/8234    (2006.01)
H01L 21/3105    (2006.01)
```
(52) U.S. Cl.
CPC .... *H01L 29/6656* (2013.01); *H01L 21/02381* (2013.01); *H01L 21/31055* (2013.01); *H01L 21/76802* (2013.01); *H01L 21/76831* (2013.01); *H01L 21/823443* (2013.01); *H01L 21/823468* (2013.01); *H01L 21/823475* (2013.01); *H01L 29/665* (2013.01); *H01L 29/66795* (2013.01); *H01L 29/785* (2013.01)

(58) Field of Classification Search
CPC ......... H01L 29/6656; H01L 21/823475; H01L 21/02381; H01L 29/66795; H01L 21/76802; H01L 21/823468
See application file for complete search history.

(56) References Cited

U.S. PATENT DOCUMENTS

| 9,147,576 | B2 | 9/2015 | Horak et al. |
| 9,461,143 | B2 | 10/2016 | Pethe et al. |
| 9,508,818 | B1 | 11/2016 | Basker et al. |
| 9,691,897 | B2 | 6/2017 | Xie et al. |
| 9,773,781 | B1 | 9/2017 | Zang et al. |
| 9,853,151 | B2 | 12/2017 | Rubin et al. |
| 2014/0077305 | A1 | 3/2014 | Pethe et al. |

(Continued)

*Primary Examiner* — Anthony Ho
(74) *Attorney, Agent, or Firm* — Cantor Colburn LLP; Joseph Petrokaitis (57) ABSTRACT

A method for forming a silicon structure. The method includes forming a trench silicide contact between two spacers, each spacer beside respective high-k metal gates. The method planarizes the trench silicide contact, the spacers, and the high-k metal gates. An inner layer dielectric is deposited over the trench silicide contact, the spacers, and the high-k metal gates. A first opening is patterned in the inner layer dielectric for a gate contact over the high-k metal gate, one of the spacers and a portion of the trench silicide contact. The method recesses the portion of the trench silicide contact and deposits a liner within the recessed portion of the trench silicide contact and on sidewalls of the first opening of the inner layer dielectric. A metallization layer is deposited in the opening in the inner layer dielectric to form the gate contact.

14 Claims, 11 Drawing Sheets

(56) References Cited

U.S. PATENT DOCUMENTS

| | | |
|---|---|---|
| 2015/0340467 A1 | 11/2015 | Bouche et al. |
| 2017/0054004 A1 | 2/2017 | Cheng et al. |
| 2017/0084742 A1 | 3/2017 | Rubin et al. |
| 2017/0263715 A1 | 9/2017 | Bouche et al. |
| 2018/0012887 A1 | 1/2018 | Labonte et al. |

NON-SELF ALIGNED GATE CONTACTS FORMED OVER THE ACTIVE REGION OF A TRANSISTOR

BACKGROUND

The present invention generally relates to semiconductor transistor devices, and more specifically, to fabrication methods and resulting structures for non-self-aligned gate contacts formed over the active region of a transistor.

Typical semiconductor devices are formed using active regions of a wafer. The active regions are defined by isolation regions used to separate and electrically isolate adjacent semiconductor devices. For example, in an integrated circuit (IC) having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. The channel region connects the source and the drain. Electrical current is induced to flow through the channel region from the source to the drain by a voltage applied at the gate electrode.

IC structures have middle of the line (MOL) contacts that connect the semiconductor devices to back end of the line (BEOL) metal levels. For example, a MOSFET can have a gate contact (also referred to herein as a CB contact) and source/drain contacts (also referred to herein as CA contacts). The gate contact can extend vertically through an interlayer dielectric (ILD) material of the IC from a metal wire or via in the first back end of the line (BEOL) metal level (referred to herein as MO) to the gate of the MOSFET. The source/drain contacts can extend vertically through the ILD material from metal wires or vias in the BEOL metal level to metal plugs (also referred to herein as TS contacts), which are on the source/drain regions of the MOSFET. Historically, in order to avoid shorts between the gate contact and the metal plugs, the gate contact is formed on a portion of the gate that is offset from the active region of the FET and, more particularly, on a portion of the gate that extends laterally over the adjacent isolation region. However, given the ever present need for size scaling of devices, methods have been developed that allow for a gate contact to be formed on a portion of the gate directly above the active region (referred to herein as a CB-over-active or CBoA) or close thereto, but ensures that the risk of a short developing between the gate contact and any of the metal plugs is avoided (or at least significantly reduced).

SUMMARY

Embodiments of the present invention are directed to method for forming a silicon structure. A non-limiting example of the method includes forming a trench silicide contact between two spacers, each spacer beside respective high-k metal gates. The method planarizes the trench silicide contact, the spacers, and the high-k metal gates. An inner layer dielectric is deposited over the trench silicide contact, the spacers, and the high-k metal gates. A first opening is patterned in the inner layer dielectric for a gate contact over the high-k metal gate, one of the spacers and a portion of the trench silicide contact. The method recesses the portion of the trench silicide contact and deposits a liner within the recessed portion of the trench silicide contact and on sidewalls of the first opening of the inner layer dielectric. A metallization layer is deposited in the opening in the inner layer dielectric to form the gate contact.

Additional embodiments of the present invention are directed to a semiconductor structure. The structure includes a substrate and a fin having a high-k metal gate with spacers on either side of the high-k metal gate on the substrate. The structure has a trench silicide, having a recess on the top of the trench silicide, on the substrate adjacent to one of the spacers and an inner layer dielectric over the fin and the trench silicide. The structure has a gate contact disposed within the inner layer dielectric above the high-k metal gate, one of the spacers, and the recess in the trench silicide and a liner disposed on either side of the gate contact and within the recess in the top of the trench silicide.

Additional embodiments of the present invention are directed to a semiconductor structure. The structure includes a substrate and a first fin having a first high-k metal gate with first and second spacers on either side of the first high-k metal gate on the substrate. The structure has a first trench silicide, having a recess on the top of the trench silicide, on the substrate adjacent to the first spacer and an inner layer dielectric over the first fin and the first trench silicide. The structure has a first gate contact disposed within the inner layer dielectric above the first high-k metal gate, the first spacer, and the recess in the first trench silicide and a first liner disposed on either side of the first gate contact and within the recess in the top of the trench silicide. The structure also has a second fin having a second high-k metal gate with third and fourth spacers on either side of the second high-k metal gate on the substrate and an inner layer dielectric over the second fin. The structure has a second gate contact disposed within the inner layer dielectric above the second high-k metal gate and the third spacer and a second liner disposed on either side of the second gate contact.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Although this detailed description includes fabrication operations and resulting structures for specific types of nonplanar FETs, implementation of the teachings recited herein are not limited to a particular type of FET or IC architecture. Rather embodiments of the present invention are capable of being implemented in conjunction with any other type of planar or nonplanar FET or IC architecture, now known or later developed.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present disclosure to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For the sake of brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices are typically formed using active regions of a wafer. In an IC having a plurality of MOSFETs, each MOSFET has a source and a drain that are formed in an active region of a semiconductor layer by incorporating n-type or p-type impurities in the layer of semiconductor material. MOSFETs device geometries can be categorized as planar or nonplanar. In planar MOSFETs, the various parts of the MOSFET device are laid down as planes or layers. In nonplanar MOSFETs, the various parts of the MOSFET device are three-dimensional (3D) structures having height, length, and width dimension. Many nonplanar MOSFET architectures form one or more portions of the transistor (e.g., channel, source, drain, gate, etc.) as a fin-shaped structure. In order to decrease the center-to-center distance (or pitch) between a given feature (e.g., gate) of adjacent transistors and increase device density on the wafer, the aspect ratios of these fin-shaped structures are often high. In other words, each fin-shaped structure in a given nonplanar MOSFET is much taller than it is wide.

A fin-type FET (FinFET) is an example of a nonplanar MOSFET that has as a main feature an elongated fin-shaped element. The gate is wrapped around a central portion of the fin. The portion of the fin that is under the gate functions as the channel. The portions of the fin that are not under the gate function as the source or the drain (S/D), respectively. The thickness of the fin determines an effective channel length of the device.

Another example of a nonplanar MOSFET is a vertical FET (VFET), which, like the FinFET, employs a semiconductor fin. In VFETs, side-gates wrap around the perimeter of the fin. The side-gates can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls.

The placement of gate contacts ("CB") without placing the gate contact on a portion of the gate that is over the active region (referred to herein as a CB-over-active or CBoA) CBoA is very restrictive. Without CBoA, placement, gate contacts are only allowed over the shallow trench isolation ("STI") region, so there are limited options to access input pins. Design rules tend to place CBs in a row and crowded together. Furthermore, as previously noted herein, the source/drain contacts can extend vertically through the ILD material from metal wires or vias in the BEOL metal level to metal plugs (also referred to herein as trench silicide (TS) contacts), which are on the source/drain regions of the MOSFET. Design rules also tend to not allow the TS contacts to pass by a CB, so there are limited wiring options. With CBoA placement, the CB can be staggered easily, providing easier access, and TS is allowed to pass by CB, providing for easier wiring. Prior attempts at CBoA required the use of a dielectric cap over the metal gate.

CBoA placement is challenging, however. Given current CB sizing, there is a high problem of CB to TS shorts. Even if one were to recess the TS, there remains a high risk of failure because the CB over-etch erodes the spacer.

Turning now to an overview of the aspects of the invention, one or more embodiments of the invention address the above-described shortcomings of the prior art by providing a method of forming middle of the line contacts by forming a lower TS contact and CMP to expose both TS and gate metal. An additional inter-layer dielectric ("ILD") is formed. A source/drain ("CA") contact resistive-ion etch ("RIE") is performed with selective recess of exposed gate metal. A CB contact RIE is performed with selective recess of exposed TS metal. An inner spacer is then formed followed by metallization.

The above-described aspects of the invention address the shortcomings of the prior art by providing the ability to stagger the placement of the CB by placing the CB over the active region in addition to also being possibly placed over the STI. This provides greater wiring flexibility than what has been done before where all of the CB need be placed over the STI. In contrast to the prior art that requires the use of a dielectric cap when placing a gate contact over an active region, that restriction is lifted by aspects of the present invention that uses an inner spacer prior to metallization of the gate contact. The inner spacer allows for slight misalignment in contact placement over active regions, without the risk of short.

Figure 1:
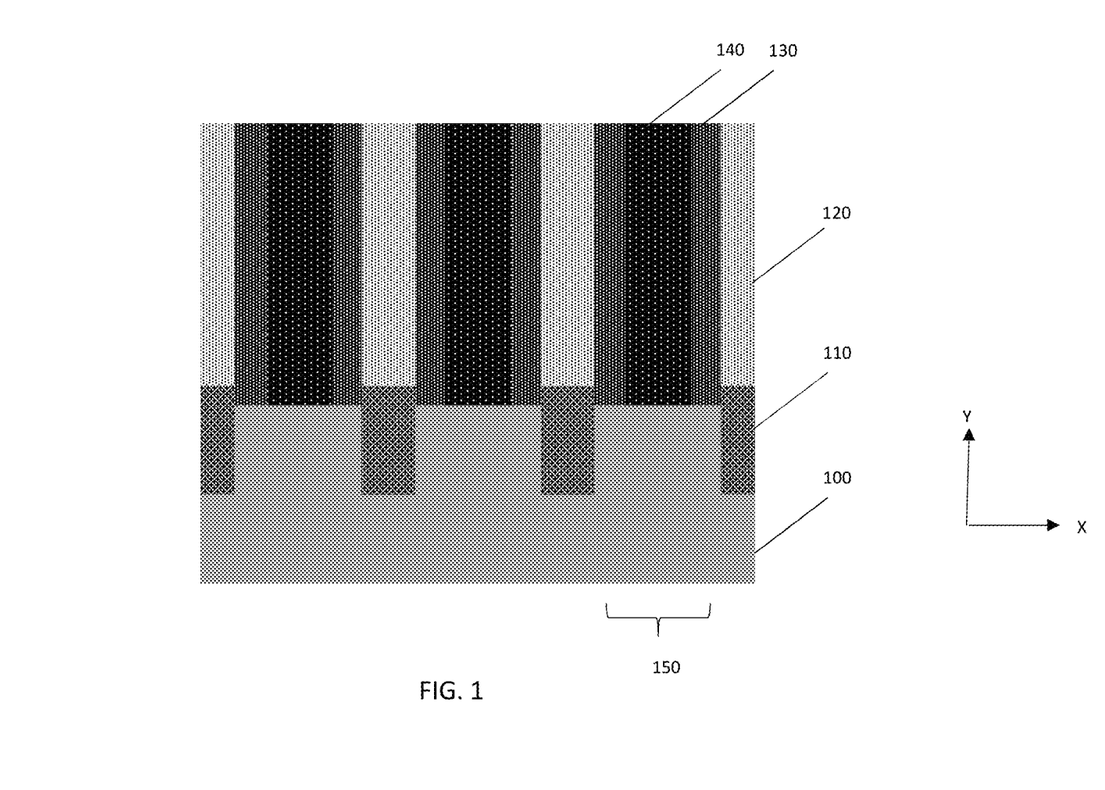
FIG. 1 depicts a cross-sectional view of a semiconductor structure after a processing operation according to one or more embodiments of the present invention.

Turning now to a more detailed description of aspects of the present invention, FIG. 1 depicts a cross-sectional view of a semiconductor structure after a processing operation according to one or more embodiments of the present invention. Shown in the figure is a series of FinFETS, but the present invention could also be used in a planar device, nanosheet, or nanowire structures. The FinFETS shown can be connected in series or parallel, depending upon how a design were to structure them. The starting structure may be conventionally fabricated, for example, using known processes and techniques. Also, unless noted otherwise, conventional processes described above may be used to achieve individual stages of the fabrication process described. FIG. 1 depicts the semiconductor after gate Tungsten CMP. A silicon substrate 100 is provided. The silicon substrate has epi regions 110 that form source/drain regions for the semiconductor. High-K Metal Gates ("HKMG") 140 are formed above the semiconductor substrate 100 and are surrounded by spacers 130. Between the fin structures 150 are ILD 120. The portion of the FinFET 150 that is between the epi regions 110 and under the gate 140 is the fin channel of the FinFET. Each of these fin structures 150 also extend in a z direction that is perpendicular to the plane of the sheet which is in the x-y direction.

Figure 2:
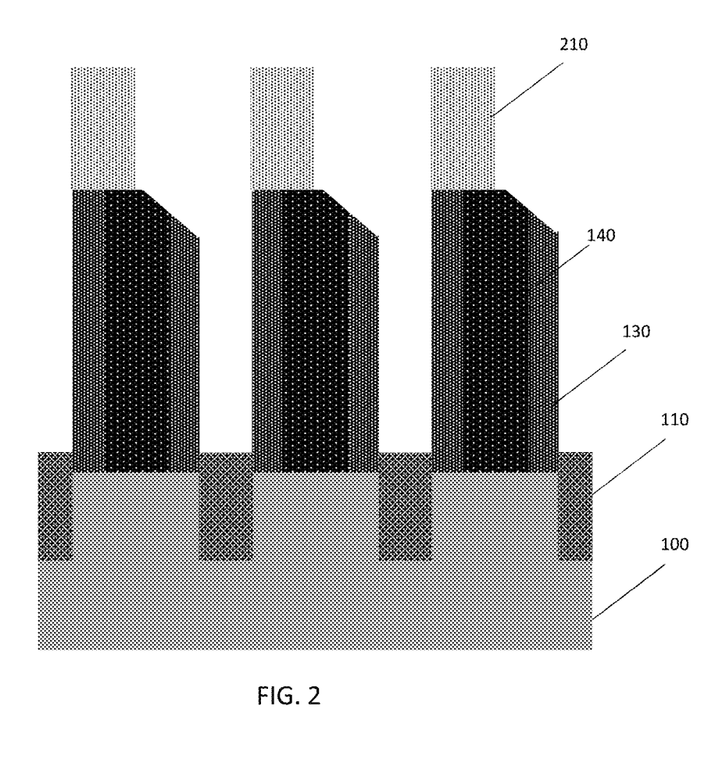
FIG. 2 depicts a cross-sectional view of a semiconductor structure after a processing operation according to one or more embodiments of the present invention.

FIG. 2 depicts a cross-sectional view of a semiconductor structure after a processing operation according to one or more embodiments of the present invention. The image shown in this figure is after a TS RIE stage has been performed. An organic planarization layer ("OPL") 210 is first deposited across the top of the structure. Then, lithography is performed to transfer the patterning to the OPL 210, leaving the OPL 210 pillars behind. An RIE is performed to remove the ILD 120, selective to HKMG 140 and spacers 130, which also may remove some portion of the spacer 130 and the HKMG 140.

Figure 3:
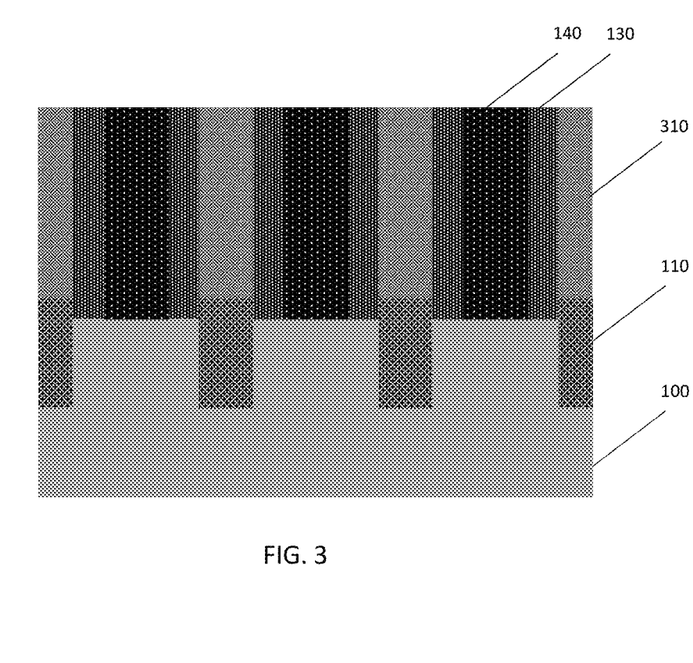
FIG. 3 depicts a cross-sectional view of a semiconductor structure after a processing operation according to one or more embodiments of the present invention.

FIG. 3 depicts a cross-sectional view of a semiconductor structure after a processing operation according to one or more embodiments of the present invention. This figure illustrates the semiconductor structure after TS metallization and CMP. The OPL layer 210 (not shown) is first removed. Then the areas opened by removal of the ILD 120 are overfilled with metal silicide, tungsten, or cobalt to form the TS regions 310. The TS regions 310 may have multiple layers. CMP is then performed to polish the surface of the semiconductor structure.

Figure 4:
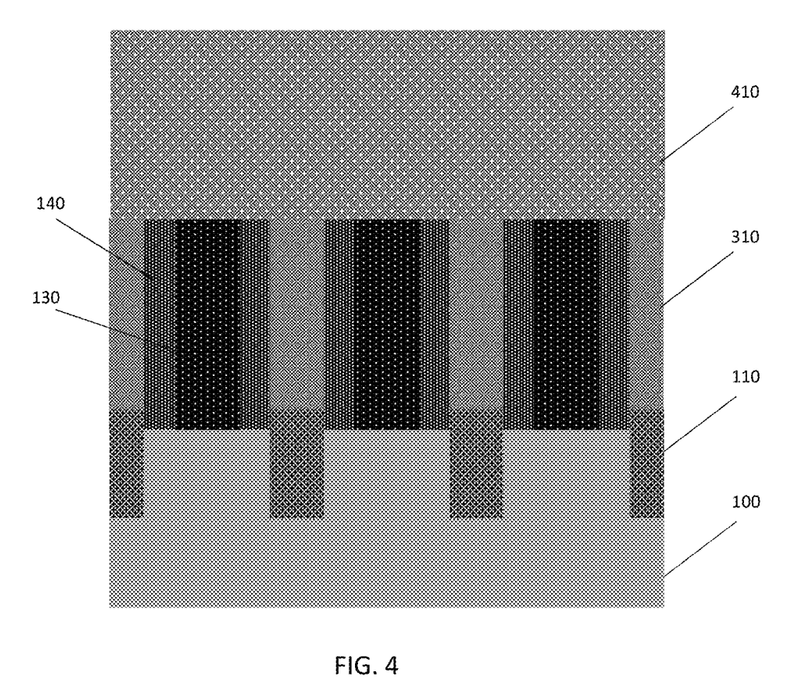
FIG. 4 depicts a cross-sectional view of a semiconductor structure after a processing operation according to one or more embodiments of the present invention.

FIG. 4 depicts a cross-sectional view of a semiconductor structure after a processing operation according to one or more embodiments of the present invention. An ILD layer 410, such as an oxide, is deposited over the surface of the semiconductor. This serves as the CA stack deposition phase. The ILD layer 410 may be multiple layers, but they are all dielectric and the ILD layer 410 may include, for example, silicon nitride or aluminum nitride followed by silicon oxide.

Figure 5:
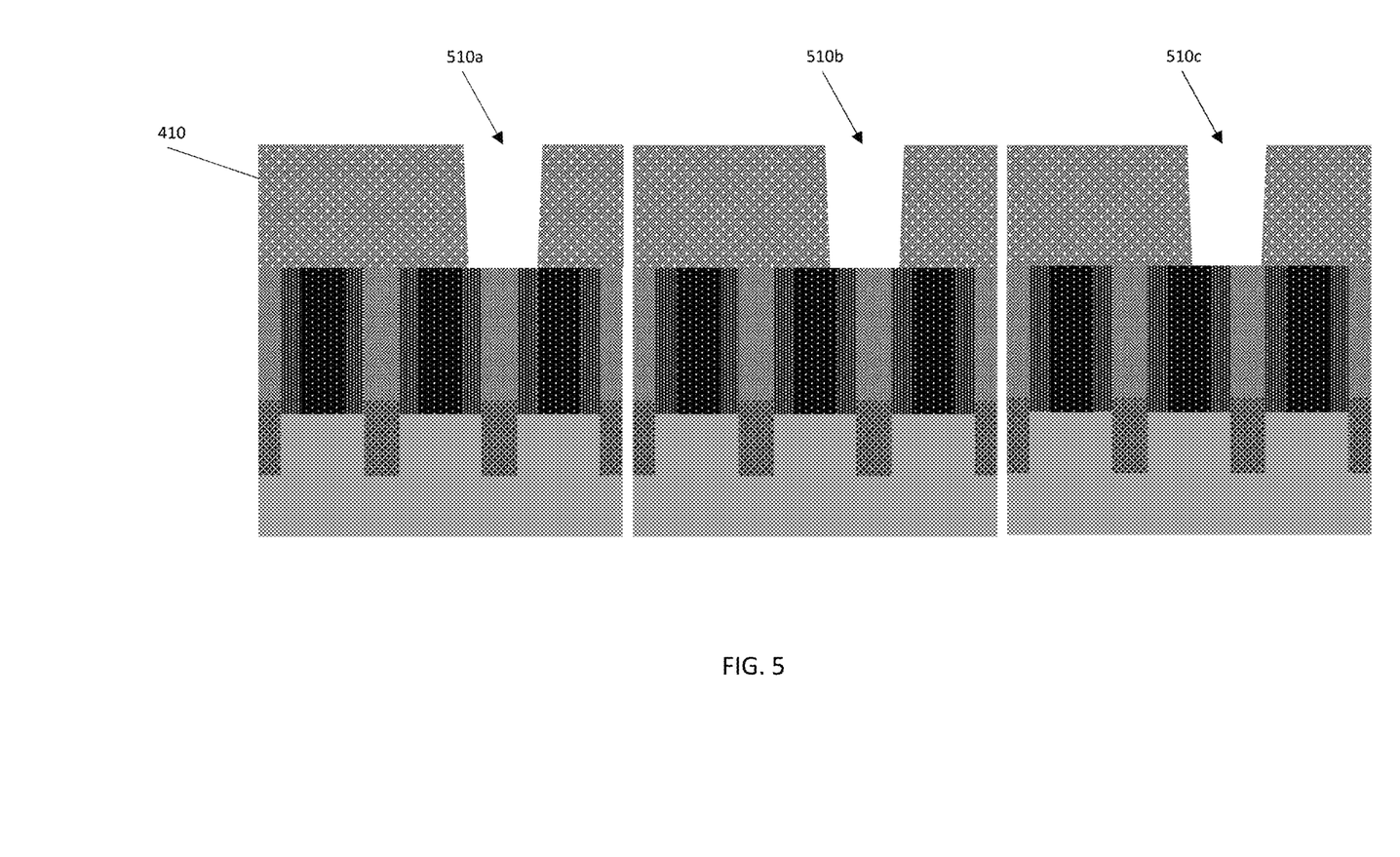
FIG. 5 depicts a cross-sectional view of a semiconductor structure after a processing operation according to one or more embodiments of the present invention.

FIG. 5 depicts a cross-sectional view of a semiconductor structure after a processing operation according to one or more embodiments of the present invention. A CA patterning phase occurs through lithography of ILD layer 410. The CA patterning phase forms openings for the upper source/drain contacts. Opening 510a is a perfectly aligned opening; opening 510b illustrates a marginally aligned opening; and opening 510c illustrates a worst aligned opening. In practice, the alignment of the openings 510 can be any combination of the above.

Figure 6:
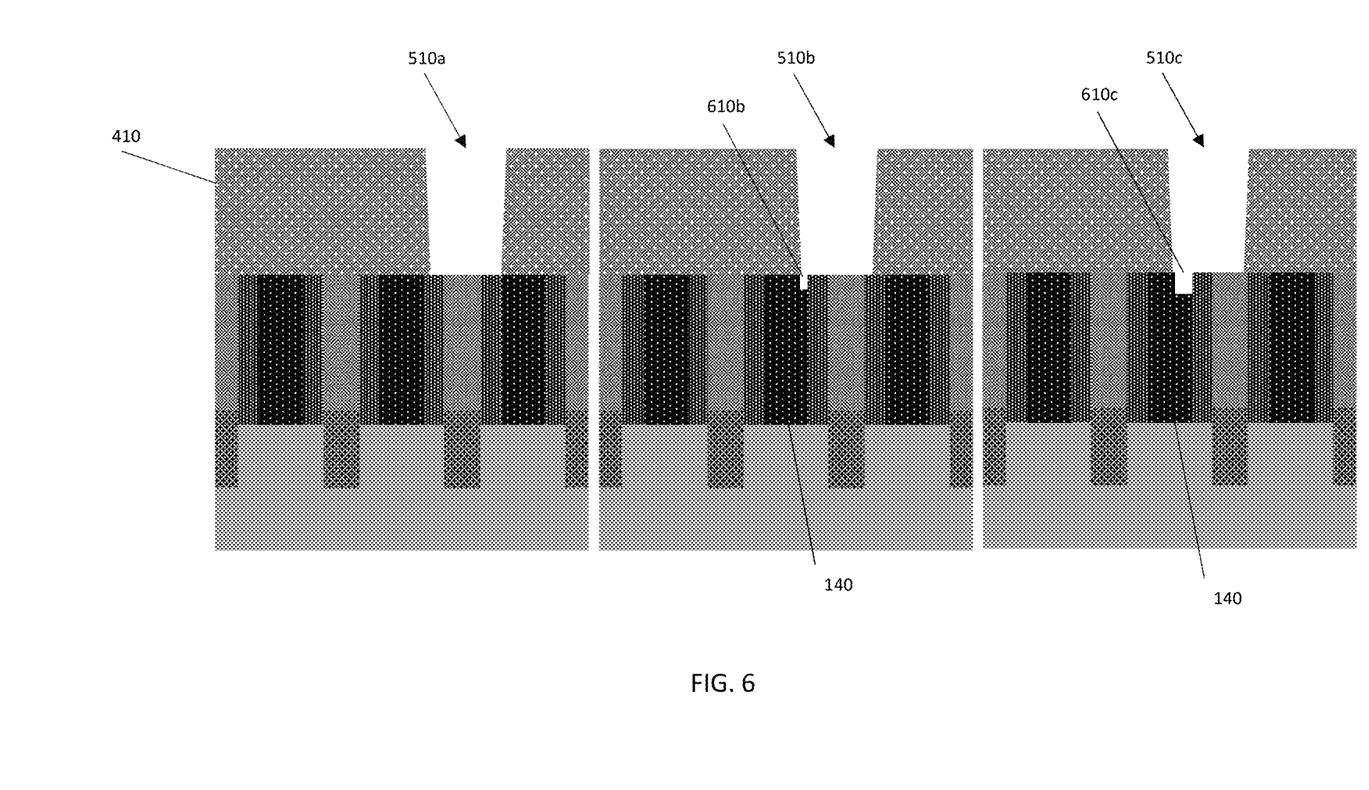
FIG. 6 depicts a cross-sectional view of a semiconductor structure after a processing operation according to one or more embodiments of the present invention.

FIG. 6 depicts a cross-sectional view of a semiconductor structure after a processing operation according to one or more embodiments of the present invention. This figure illustrates the gate metal recess stage which is performed by performing a selective metal recess As can be seen at the bottom of the openings 510b and 510c, a recess 610bb and 610c is etched selective to TiN or Tungsten in the HKMG 140.

Figure 7:
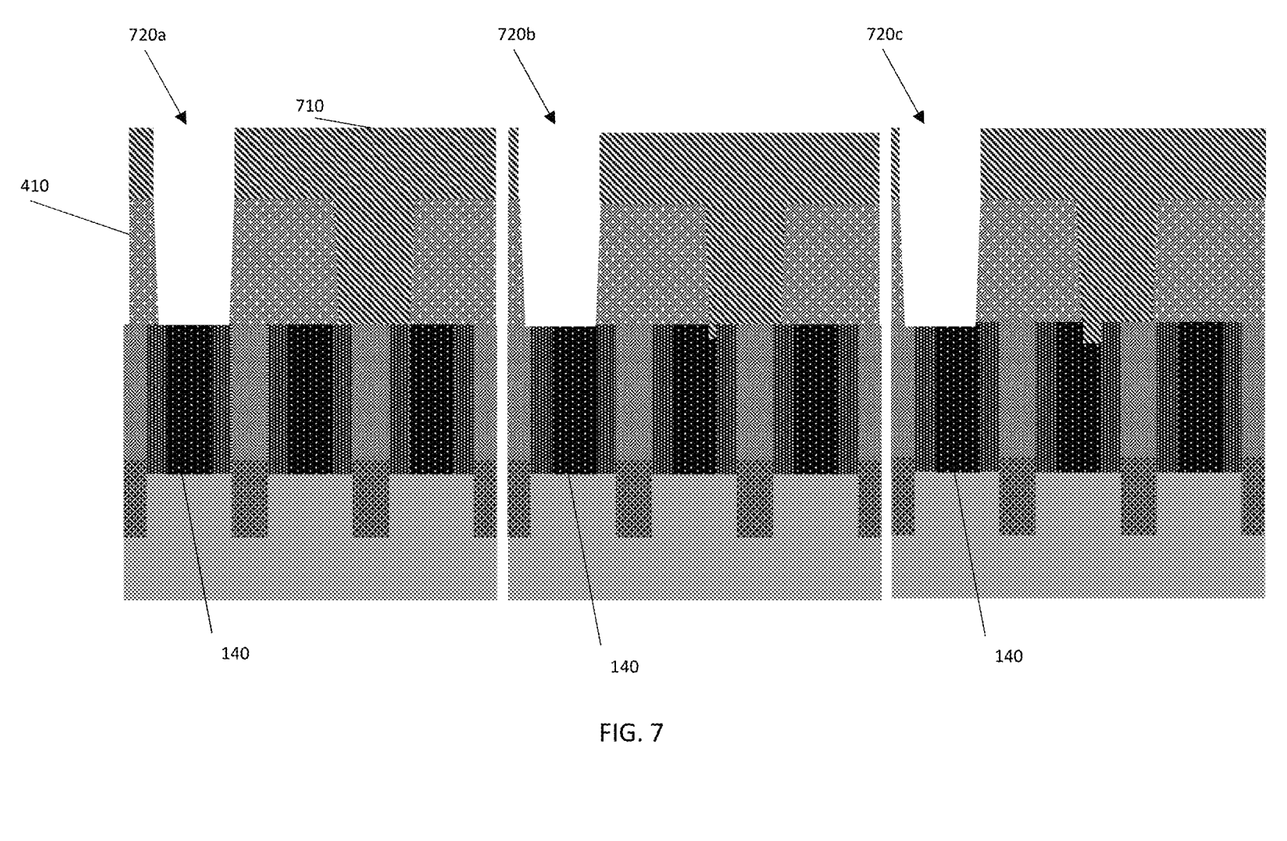
FIG. 7 depicts a cross-sectional view of a semiconductor structure after a processing operation according to one or more embodiments of the present invention.

FIG. 7 depicts a cross-sectional view of a semiconductor structure after a processing operation according to one or more embodiments of the present invention. CB patterning is next performed. An OPL 710 is deposited and patterned through lithography forming the openings 710a, 710b, and 710c to the HKMG 140. Opening 710a in this example is near perfectly aligned. Opening 710b has marginal alignment. And, opening 710c has the worst alignment. In practice, the alignment of the openings 710 can be any combination of the above. Note that the OPL 710 gets deposited in the recesses 610b and 610c that were created in the previous figure.

Figure 8:
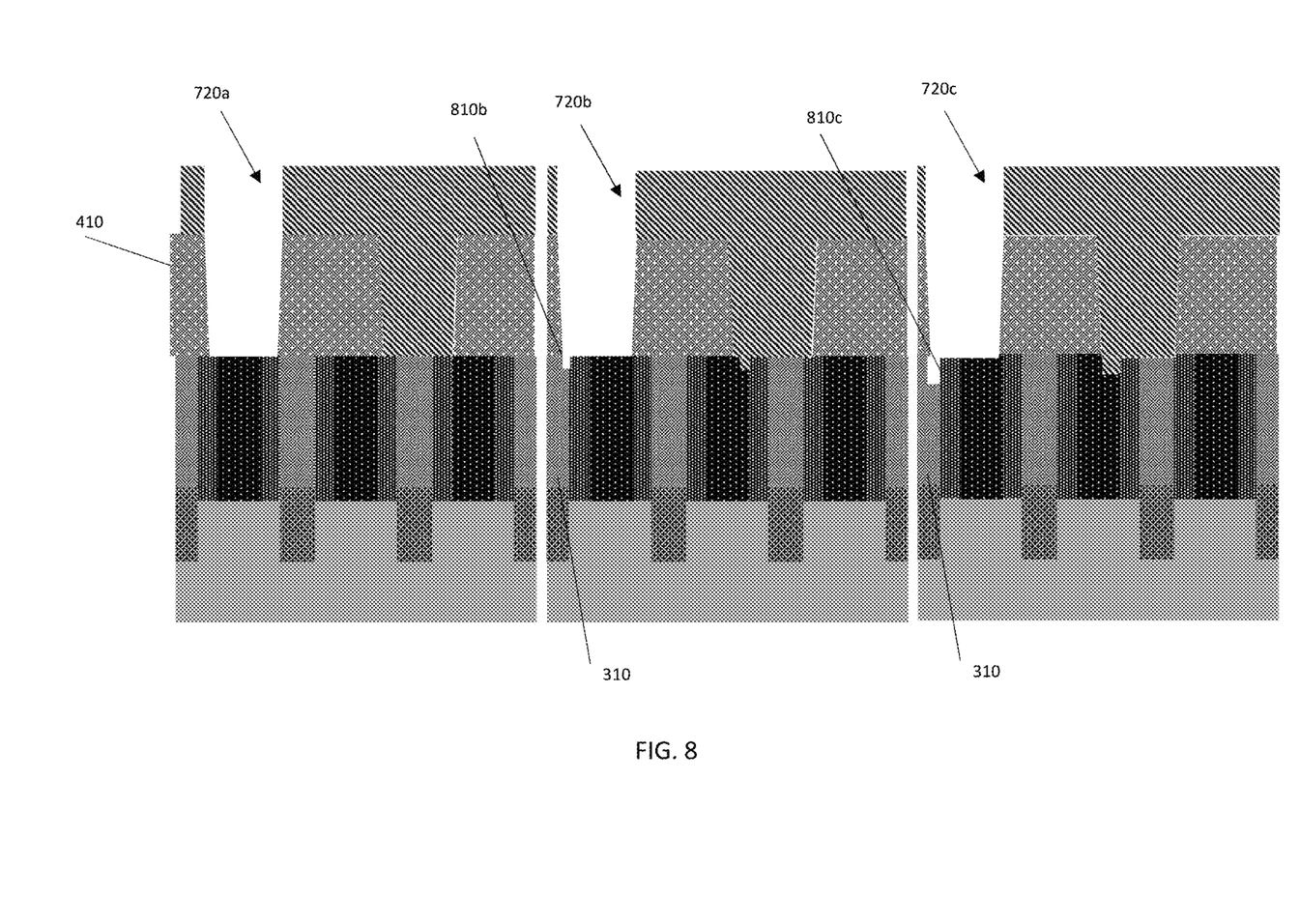
FIG. 8 depicts a cross-sectional view of a semiconductor structure after a processing operation according to one or more embodiments of the present invention.

FIG. 8 depicts a cross-sectional view of a semiconductor structure after a processing operation according to one or more embodiments of the present invention. There is now another selective Cobalt recess to the TS 310. This results in a gap 810b being formed in TS 310 in opening 710b and a larger gap 810c being formed in TS 310 in opening 710c. These gaps are created due to the misalignment of the openings.

Figure 9:
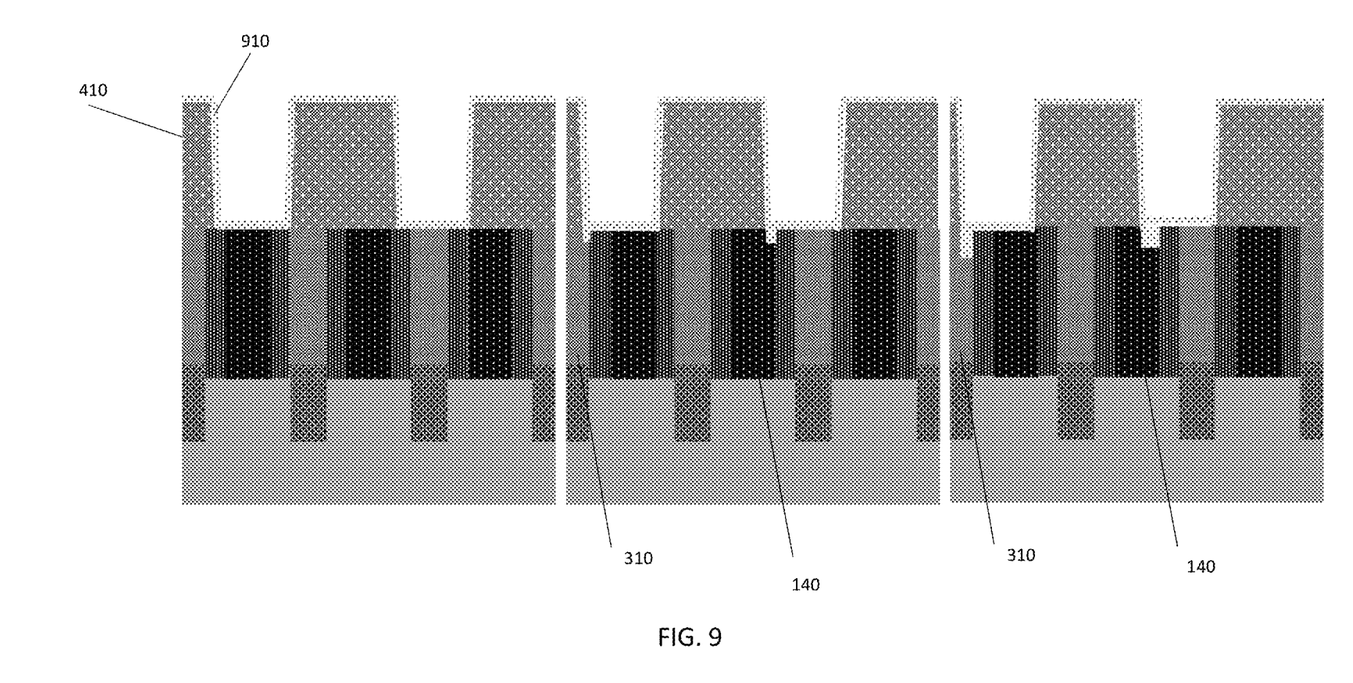
FIG. 9 depicts a cross-sectional view of a semiconductor structure after a processing operation according to one or more embodiments of the present invention.

FIG. 9 depicts a cross-sectional view of a semiconductor structure after a processing operation according to one or more embodiments of the present invention. The OPL 710 is stripped off and a spacer liner 910 is deposited. The spacer liner 910 is deposted using conformal deposition, such as ALD or CVD. The thickness of the spacer liner 910 should be at least greater than half the width of the gaps. Note that the spacer liner is deposited into the gaps in the TS 310 and the HKMG 140 that were made earlier in the process.

Figure 10:
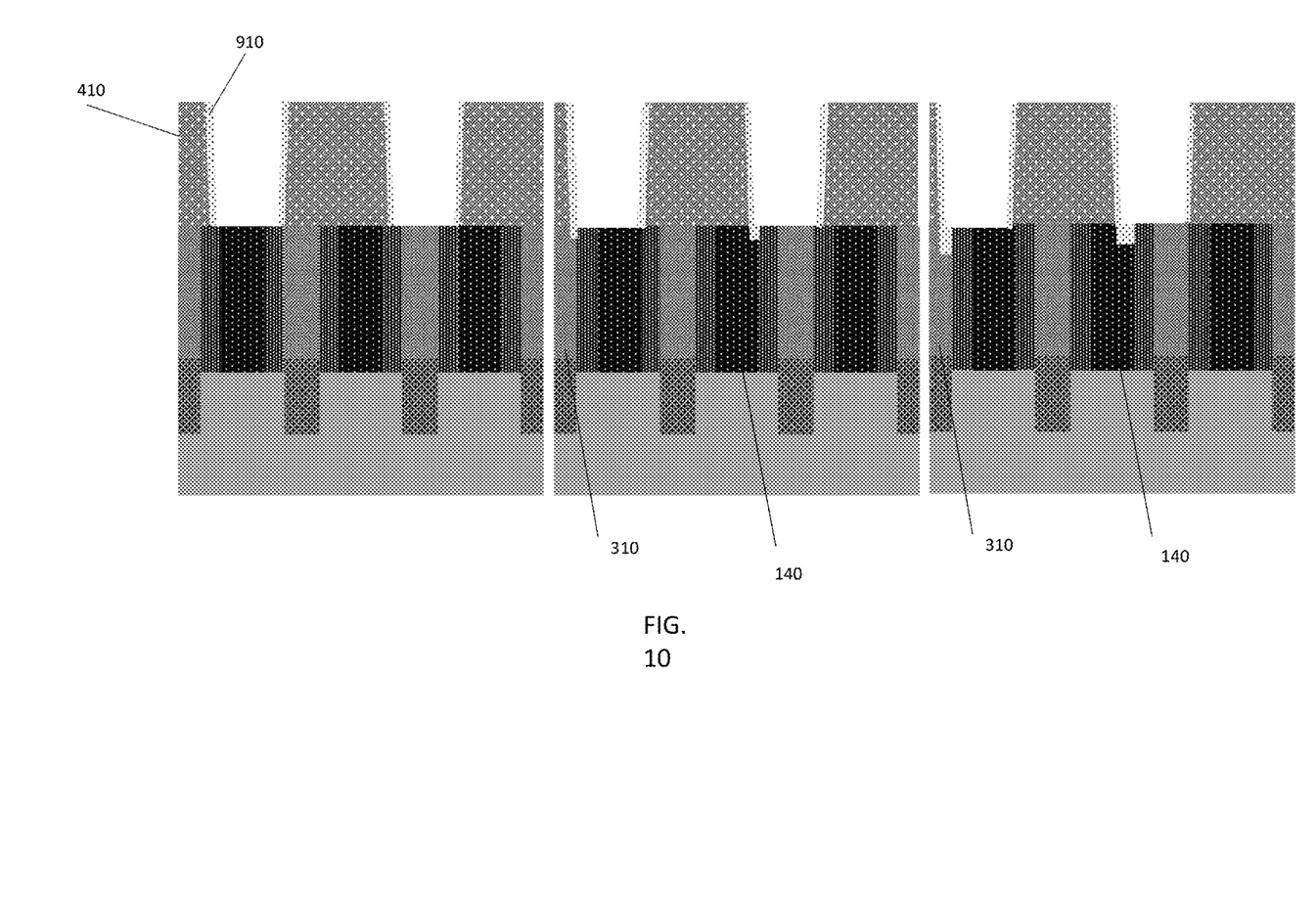
FIG. 10 depicts a cross-sectional view of a semiconductor structure after a processing operation according to one or more embodiments of the present invention.

FIG. 10 depicts a cross-sectional view of a semiconductor structure after a processing operation according to one or more embodiments of the present invention. A directional spacer RIE is performed to remove spacer liner 910 from the horizontal surfaces of the semiconductor. Note that the spacer liner 910 remains in the gaps in the TS 310 and the HKMG 140 that were made earlier in the process.

Figure 11:
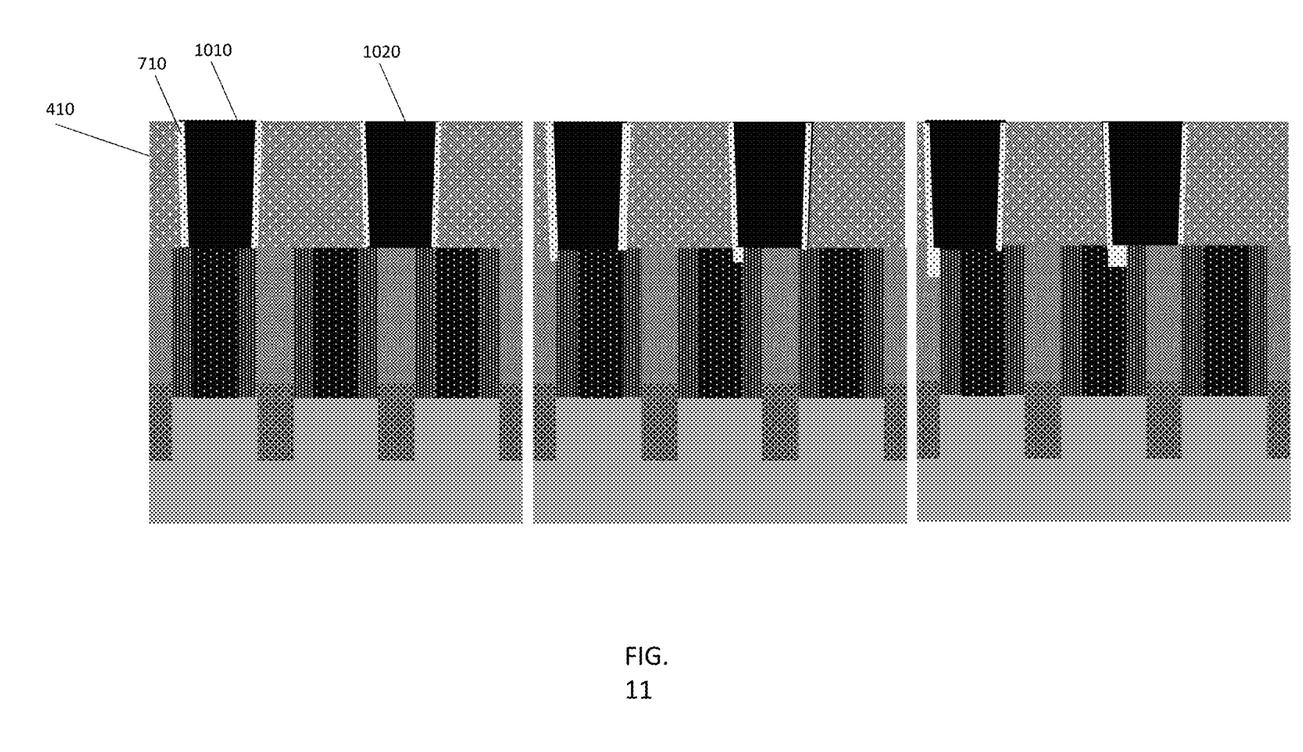
FIG. 11 depicts a cross-sectional view of a semiconductor structure after a processing operation according to one or more embodiments of the present invention.

FIG. 11 depicts a cross-sectional view of a semiconductor structure after a processing operation according to one or more embodiments of the present invention. CA and CB metallization now occurs to place the CA 1020 and the CB 1010 into the provided spaces. Because of the presence of the spacer liner 910, the CA and CB contacts touch only the desired portion of the semiconductor. Absent the presence of the spacer liner, the CB would electrically connect to the TS.

Accordingly, it can be seen from the foregoing detailed description that aspects of the invention provide technical benefits and effects. Embodiments of the invention provide fabrication methods and resulting structures for devices, such as FinFETs, nanowires, or nanosheets, that allow the placement of contacts, CA and CB, over active layers of the device. Through the disclosed etching and spacer liner deposition, contacts can be placed over active regions without risk that there will be an electrical short between CB and TS, for example. Through use of a spacer liner, no dielectric cap over the gate needs to be used.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, ALD among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a silicon structure, the method comprising:
    forming a trench silicide contact between two spacers, each spacer beside respective high-k metal gates;
    planarizing the trench silicide contact, the spacers, and the high-k metal gates;
    depositing an inner layer dielectric over the trench silicide contact, the spacers, and the high-k metal gates;
    patterning a first opening in the inner layer dielectric for a gate contact over the high-k metal gate, one of the spacers and a portion of the trench silicide contact;
    recessing the portion of the trench silicide contact;
    depositing a liner within the recessed portion of the trench silicide contact and on sidewalls of the first opening of the inner layer dielectric; and
    depositing a metallization layer in the opening in the inner layer dielectric to form the gate contact.

2. The method of claim 1, further comprising patterning a second opening in the inner layer dielectric for a source/drain contact over the trench silicide contact, the other one of the spacers, and a portion of the high-k metal gate.

3. The method of claim 2, further comprising recessing the portion of the high-k metal gate.

4. The method of claim 3, wherein the liner is further deposited on sidewalls of the second opening of the inner layer dielectric and within the recessed portion of the high-k metal gate.

5. The method of claim 4, further comprising depositing the metallization layer in the second opening in the inner layer dielectric to form the source/drain contact.

6. The method of claim 1, wherein depositing a liner within the recessed portion of the trench contact and on sidewalls of the first opening of the inner layer dielectric, further comprises depositing the liner on top of the inner layer dielectric and on the high-k metal gate.

7. The method of claim 6, further comprising removing the liner from the top of the inner layer dielectric and the high-k metal gate.

8. The method of claim 2, further comprising, prior to patterning the second opening, depositing an organic planarization layer over the inner layer dielectric and within the first opening.

9. The method of claim 8, further comprising, removing the organic planarization layer before depositing the liner.

10. The method of claim 1, wherein forming a trench silicide contact between two spacers, each spacer beside respective high-k metal gates, comprises depositing an organic planarization layer on one of the spacers and at least a portion of the high-k metal gate.

11. The method of claim 10, wherein forming a trench silicide contact between two spacers further comprises etching away an inner layer dielectric disposed between the two spacers.

12. The method of claim 11, wherein forming a trench silicide contact between two spacers, further comprises removing the organic planarization layer by ashing the organic planarization layer.

13. The method of claim 12, wherein forming a trench silicide contact between two spacers, further comprises overfilling the opening left behind by etching away the inner layer dielectric with a metal.

14. The method of claim 13, wherein the metal is selected from the group consisting of silicide, cobalt, or tungsten.

* * * * *